(12) United States Patent
Balut et al.

(10) Patent No.: US 8,431,491 B2
(45) Date of Patent: Apr. 30, 2013

(54) METHOD FOR MEMBRANE PROTECTION DURING REACTIVE ION/PLASMA ETCHING PROCESSING FOR VIA OR CAVITY FORMATION IN SEMICONDUCTOR MANUFACTURE

(75) Inventors: Chester E. Balut, Atkinson, NH (US); Frank Leonard Schadt, III, Wilmington, DE (US); Stephen E. Vargo, Arcadia, CA (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 556 days.

(21) Appl. No.: 12/609,353

(22) Filed: Oct. 30, 2009

(65) Prior Publication Data

US 2010/0112820 A1 May 6, 2010

Related U.S. Application Data

(60) Provisional application No. 61/111,023, filed on Nov. 4, 2008, provisional application No. 61/147,501, filed on Jan. 27, 2009.

(51) Int. Cl.
*H01L 21/302* (2006.01)

(52) U.S. Cl.
USPC ........... 438/694; 438/689; 438/700; 438/706; 438/710; 216/17; 216/41; 216/67

(58) Field of Classification Search ........................ None
See application file for complete search history.

(56) References Cited

U.S. PATENT DOCUMENTS

| 2004/0087054 A1* | 5/2004 | Chinn et al. ..................... 438/52 |
| 2006/0024965 A1* | 2/2006 | Yang ............................. 438/689 |
| 2007/0224818 A1* | 9/2007 | Nishimura ..................... 438/689 |
| 2007/0262317 A1* | 11/2007 | Oh ................................. 257/72 |

OTHER PUBLICATIONS

A.D. Radadia et al., MEMS 2007, pp. 361-364, Jan. 2007.*
H. Xiao, Introduction to Semiconductor Manufacturing Technology, published by Prentice Hall, 2001, ISBN 0-13-022404-9, pp. 335-341.*
A.K. Diby et al., eXPRESS Polymer Letters, vol. 1, 2007, pp. 673-680.*
C. Grant Wilson, Organic Resist Materials, American Chemical Society, Introduction to Microlithography, Second Edition, Chapter 3, pp. 139-267.

* cited by examiner

*Primary Examiner* — Lan Vinh
*Assistant Examiner* — Jiong-Ping Lu

(57) ABSTRACT

A method for protecting a chuck membrane in a reactive ion etcher during plasma processing is described. The method utilizes a photoresist as a protective layer. Suitable photoresists can be used in this invention to not only image a semiconductor substrate to protect areas where vias and/or cavities are not desired during plasma processing but also to protect the chuck membrane(s) of the reactive ion etcher from being damaged and/or contaminated during plasma processing. Both negative-working and positive-working photoresists can be used.

7 Claims, No Drawings

METHOD FOR MEMBRANE PROTECTION DURING REACTIVE ION/PLASMA ETCHING PROCESSING FOR VIA OR CAVITY FORMATION IN SEMICONDUCTOR MANUFACTURE

CROSS REFERENCE TO RELATED APPLICATIONS

This application claims priority to provisional patent application No. 61/111,023 that was filed on Nov. 4, 2008 and to provisional patent application No. 61/147,501 that was filed on Jan. 27, 2009.

BACKGROUND OF THE INVENTION

Reactive ion etching (RIE) systems are widely used in semiconductor manufacture to form vias in silicon and other substrates using plasma gas based systems. A typical RIE process uses a plasma generation chamber with a wafer/substrate mounted on a chuck with a membrane for cooling gases. The purpose of the chuck is to maintain planarity in relationship to the plasma being generated in the chamber and to control the temperature of the substrate/wafer during RIE processing. Maintaining planarity is critical to ensuring that vias are formed perpendicular to the outer surfaces of wafers being processed, such that the resulting processed wafers will maintain accurate position and characteristics for connection to other dies or wafers. The RIE process is temperature dependent and tight temperature control is required to enable uniform via formation across the entire substrate/wafer.

A problem with plasma etching may occur as plasma completes etching through the substrate/wafer thickness and starts to expose the chuck membrane to the plasma etching gases. If not protected, the membrane used on the chuck holding the substrate becomes contaminated and with time damaged. Furthermore, after the backside of the wafer/substrate is penetrated during RIE processing, another problem may occur as the plasma is then reflected off the typical membrane protection in current use. In this case, excessive etching or lateral growth at the bottom of the via being formed may result.

In view of the above drawbacks, the standard current industry practice to eliminate the problems with protecting the chuck membrane and to minimize lateral growth in via diameter at its base is to use additional carrier wafers with special thermally conductive adhesives to maintain a rather uniform temperature distribution across the wafer surface. However, application of a uniform coating of thermally conductive adhesive can be difficult but must be tightly controlled to maintain the required planarity for vertical via formation. Furthermore, thermally conductive adhesive systems often generate a large amount of residues, which requires frequent cleanout of the plasma chamber. Consequently, the use of a carrier substrate in combination with a thermally conductive adhesive to protect the chuck membrane during plasma processing can be costly and contribute towards high scrap levels of processed semiconductor wafers.

Use of liquid photoresists has been tried and found to have significant drawbacks. Two major drawbacks are resulting non-uniform surfaces and potential etching problems from lack of planarity of the chuck in a plasma etcher.

There is a need for a reactive ion/plasma etching method that effectively protects the chuck membrane and provides good planarity during plasma processing while not generating large amounts of residues that lead to more frequent and time consuming cleanups of plasma chambers. The present invention provides a solution to this significant need.

BRIEF SUMMARY OF THE INVENTION

In an embodiment, the invention is a method for conducting reactive ion/plasma etching on a wafer in semiconductor manufacture, said wafer having a surface and an opposing surface, and said method comprising the steps of:
 a) applying a dry film photoresist to the surface of the wafer to afford a dry film photoresist/wafer assembly, said dry film photoresist having a surface and an opposing surface;
 b) placing the opposing surface of the dry film photoresist of the dry film photoresist/wafer assembly in contact with a chuck membrane of a piece of equipment for effecting reactive ion/plasma etching; and
 c) initiating a reactive ion/plasma etching process to effect formation of at least one via or cavity in the wafer.

In an embodiment, the invention is the above method that includes a step d) applying dry film photoresist to the opposing surface of the wafer on areas where via and cavity formation is desired and photoimaging the dry film to define where in the wafer the at least one via or cavity will be formed upon subsequent processing in semiconductor manufacture, wherein step d) may optionally be carried out prior to step a). Suitable actinic radiation includes, but is not limited to, ultraviolet light.

In an additional embodiment, the invention is the above method that includes a step d) exposing the dry film photoresist to actinic radiation to at least partially photoreact the dry film photoresist, wherein step d) is carried out after step a) and prior to step c). Suitable actinic radiation includes, but is not limited to, ultraviolet light.

DETAILED DESCRIPTION OF THE INVENTION

In this invention, a photoresist is used as a protective layer to protect a chuck membrane(s) in reactive ion/plasma etching equipment during use of this equipment in processing wafers to effect reactive ion/plasma etching in semiconductor manufacture. The photoresist is used to protect the chuck membrane(s) of reactive ion/plasma etching equipment instead of conventional means such as a thermally conductive adhesive on a (carrier) substrate. The photoresist serves to protect the chuck membrane(s) from being damaged by hot plasma gases as well as from being contaminated during plasma processing.

The photoresist used in this invention is a dry film photoresist. Suitable commercial photoresists for use in this invention include, but are not limited to, MX5000 and WBR2000 photoresists supplied by E. I. du Pont de Nemours & Company, Wilmington, Del.

Both negative-working and positive-working photoresists can be utilized according to the invention. Negative-working photoresists are preferred. Examples of negative-working photoresists are the MX5000 and WBR2000 photoresists described above. Negative-working photoresists are generally characterized to have increased molecular weight and crosslink density in exposed area(s) upon photoimaging. In contrast, positive-working photoresists are generally characterized to have decreased molecular weight and crosslink density in exposed area(s) upon photoimaging.

The photoresist, following lamination to a wafer on a side that is not to be photoimaged, can in an embodiment of the invention not be photoimaged prior to its being used to protect the chuck membrane. In this embodiment, the photoresist contains un-reacted photoreactive groups prior to the start of plasma processing. Plasma processing in the RIE chamber typically causes at least some photoreaction of photoreactive groups in the resist to allow the formation of increased molecular weight and crosslink density for negative-working photoresists, such that the photoresist becomes at least partially cured during the plasma processing and may soon become fully cured, depending upon operating conditions. In this embodiment, the plasma serves a dual role of affording means for etching the wafer as well as curing the photoresist to have higher molecular weight and possibly also higher crosslink density and thereby be a better protective film in this application.

In another embodiment, the photoresist, following lamination to a wafer on a side that is not to be photoimaged, can be photocured to various degrees prior to its being used to protect the chuck membrane. In this embodiment, the negative-working photoresist will have higher molecular weight and possibly also higher crosslink density as a result of photocuring at the start of plasma processing and is consequently prophesized to afford better protection of the chuck membrane. An advantage of this embodiment is that the photocuring is more uniform than expected from exposure during the plasma treatment.

The wafers being processed in the method can be, but are not limited to, silicon-based wafers.

EXAMPLES

Example 1 (Prophetic)

DuPont MX5020 photoresist (having a thickness of 20 microns) is laminated to both a face and an opposing face of a silicon wafer and the photoresist on the opposing face is then photoimaged (i.e., exposed and developed) to define areas of the silicon wafer to be protected during reactive ion etching and to define areas where vias and/or cavities are desired. The dry film photoresist on the face is not photoimaged. The resulting unimaged photoresist/silicon wafer/imaged resist assembly is placed in a chuck such that the unimaged resist is in direct contact with a chuck membrane of the chuck of a reactive ion etcher. The reactive ion etcher is operated to effect etching of vias and/or cavities at places not protected by the photoresist on the face of the wafer. The vias produced extend all the way through the silicon wafer. The dry film photoresist serves not only to protect the silicon wafer during reactive ion etching in areas where vias and/or cavities are not desired but also to protect the chuck membrane from being damaged by the hot and reactive plasma gases and to also protect the membrane from being contaminated during this plasma processing. Minimal residues, if any, are observed in the reactive ion etcher following this plasma processing with use of this photoresist.

Example 2 (Prophetic)

This example is the same as Example 1 except that DuPont WBR2000 photoresist is used in place of the MX5020 photoresist used in Example 1. Results are similar to those described in Example 1.

Example 3 (Prophetic)

This example is the same as Example 1 except that, following lamination of the photoresist to the silicon wafer, the photoresist on the face of the wafer is photocured by exposing it to wave lengths of ultraviolet light to which the film is sensitive. This photocuring increases the molecular weight and crosslink density in the cured photoresist relative to that in the uncured photoresist. Having a photocured resist with higher molecular weight and higher crosslink density in place to protect the membrane at the start of plasma processing is prophesized to afford a higher level of protection of the chuck membrane from being damaged/degraded by plasma during plasma processing.

Example 4 (Prophetic and Comparative)

In this comparative example, a silicon wafer substrate containing a layer of a conductive adhesive is used to protect the chuck membrane of a reactive ion etcher instead of a photoresist. The silicon wafer/conductive adhesive serves to protect the chuck membrane during plasma processing but its use affords higher levels of contaminants in the plasma chamber of the equipment, which results requires more frequent cleaning of the chamber.

Example 5

A 200 mm Type S silicon wafer having multiple via and trench dies was used in this example. The vias ranged in diameter from 5 microns to 200 microns, and the trench die lines ranged from 3 microns to 200 microns. The silicon wafer was resist patterned on its front side using Shipley SPR220 photoresist having a thickness of 8 microns. MX5020 photoresist (E. I. du Pont de Nemours and Company, Wilmington, Del.) having a thickness of 20 microns was then laminated to the backside of the resulting patterned wafer using a DuPont HRL24 laminator operated at 110° C. hot roll temperature at 0.8 meters./minute, and 20 pounds per square inch roll pressure.

Following lamination, the patterned front side of the silicon wafer was examined. The resist pattern was visually observed to be the same as it was prior to lamination except for some smudge marks around the wafer edges. The thickness and resist sidewall profile on the front side were unchanged after lamination as determined using profilometer and SEM analysis.

The patterned wafer having MX5020 photoresist laminated on the backside of the wafer was placed in a Pegasus™ reactive ion etcher (RIE) (ST Systems, Newport, United Kingdom) with the MX5020 photoresist being in contact with the membrane of the RIE. The reactive ion etcher was operated under standard Bosch etch conditions to effect etching of the wafer in areas not protected with resist. The MX5020 photoresist on the backside of the wafer effectively protected the chuck membrane of the etcher from being damaged during RIE processing and did not have any deleterious effect on the etch results obtained on the front side of the wafer (i.e., areas on the front side of the wafer not protected by photoresist were cleanly etched while those areas protected by photoresist were not etched).

Example 6

This example is the same as Example 5 except that the thickness of the patterned photoresist was 3.5 microns instead of 8 microns. Results were basically the same as for Example 4 except that there were fewer smudge marks around the edge of the wafer using the 3.5 micron thick photoresist compared to the 8 micron thick photoresist.

What is claimed is:

1. A method for conducting reactive ion/plasma etching on a wafer in semiconductor manufacture, said wafer having a surface and an opposing surface, and said method comprising the steps of:
   a) applying a dry film photoresist to the surface of the wafer to afford a dry film photoresist/wafer assembly, said dry film photoresist having a surface and an opposing surface;
   b) placing the opposing surface of the dry film photoresist of the dry film photoresist/wafer assembly in contact with a chuck membrane of a piece of equipment for effecting reactive ion/plasma etching; and
   c) initiating a reactive ion/plasma etching process to effect formation of at least one via or cavity in the wafer wherein the photoresist protects the chuck membrane of the equipment for effecting reactive ion/plasma etching during its use for this purpose.

2. The method of claim 1 wherein the reactive ion/plasma etching is done to effect via formation.

3. The method of claim 1 wherein the reactive ion/plasma etching is done to effect cavity formation.

4. The method of claim 1 further comprising a step d) applying a dry film photoresist to the opposing surface of the wafer on areas where via and cavity formation is desired and photoimaging the dry film to define where in the wafer the at least one via or cavity will be formed upon subsequent processing in semiconductor manufacture, wherein step d) may optionally be carried out prior to step a).

5. The method of claim 1 wherein the dry film photoresist is a negative-working photoresist.

6. The method of claim 5 further comprising a step d) exposing the dry film photoresist to actinic radiation to at least partially photoreact the dry film photoresist, wherein step d) is carried out after step a) and prior to step c).

7. The method of claim 6 wherein the actinic radiation is ultraviolet light.

* * * * *